United States Patent
Ngo et al.

(10) Patent No.: US 7,060,554 B2
(45) Date of Patent: Jun. 13, 2006

(54) PECVD SILICON-RICH OXIDE LAYER FOR REDUCED UV CHARGING

(75) Inventors: Minh Van Ngo, Fremont, CA (US); Mark Ramsbey, Sunnyvale, CA (US); Tazrien Kamal, San Jose, CA (US); Pei Yuan Gao, San Jose, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 122 days.

(21) Appl. No.: 10/617,451

(22) Filed: Jul. 11, 2003

(65) Prior Publication Data

US 2005/0006712 A1 Jan. 13, 2005

(51) Int. Cl.
*H01L 21/8242* (2006.01)
*H01L 21/336* (2006.01)

(52) U.S. Cl. .................. 438/240; 438/263; 438/624
(58) Field of Classification Search ............... 438/240, 438/263, 624, 3, 623, 266, 395, 396, 622, 438/637, 626, 631, 699, 763, 257; 257/317, 257/296, 325, 324, 314, 390, 391
See application file for complete search history.

(56) References Cited

U.S. PATENT DOCUMENTS

| | | | |
|---|---|---|---|
| 5,128,279 A | | 7/1992 | Nariani et al. |
| 5,290,727 A | | 3/1994 | Jain et al. |
| 5,602,056 A | | 2/1997 | Jain et al. |
| 5,693,566 A | * | 12/1997 | Cheung ............... 438/624 |
| 6,274,429 B1 | | 8/2001 | Misra |
| 6,348,407 B1 | * | 2/2002 | Gupta et al. ........... 438/637 |
| 6,518,070 B1 | * | 2/2003 | Alluri et al. ........... 438/3 |
| 6,559,007 B1 | * | 5/2003 | Weimer ............... 438/257 |
| 6,833,581 B1 | * | 12/2004 | Hui et al. ............. 257/317 |

OTHER PUBLICATIONS

Wolf et al., "Silicon Processing for the VLSI Era", 1986, Lattice Press, vol. 1, p. 398.*

* cited by examiner

*Primary Examiner*—Walter L. Lindsay, Jr.

(57) ABSTRACT

A Si-rich silicon oxide layer having reduced UV transmission is deposited by PECVD, on an interlayer dielectric, prior to metallization, thereby reducing $V_t$. Embodiments include depositing a UV opaque Si-rich silicon oxide layer having an R.I. of 1.7 to 2.0.

7 Claims, 1 Drawing Sheet

PECVD SILICON-RICH OXIDE LAYER FOR REDUCED UV CHARGING

FIELD THE INVENTION

The present invention relates to a method of fabricating semiconductor devices having high reliability and the resulting semiconductor devices. The present invention has particular applicability in fabricating microminiaturized flash memory devices with reduced UV cell charging.

BACKGROUND ART

Various issues arise in attempting to satisfy the ever increasing demands for microminiaturization, particularly in fabricating non-volatile semiconductor devices, such as flash memory devices, e.g., electrically erasable programmable read only memory (EEPROM) devices. The demands for continuing microminiaturization led to the fabrication of flash memory devices comprising transistors having a gate width of about 0.13 micron and under and gate structures spaced apart by a small gap of about 0.30 micron or less. In accordance with conventional practices, an oxide sidewall spacer is formed on side surfaces of the gate stack, and the first interlayer dielectric ($ILD_0$) is deposited over the gate structures filling the gaps therebetween.

As microminiaturization proceeds apace, various reliability issues arise, particularly as EEPROM device dimensions are scaled into the deep sub-micron regime, such as UV charging during back end of line processing, such as deposition, metal etching and passivation, particularly during plasma processing. UV radiation generated during such processing results in undesirable UV charging of the flash memory devices with an attendant increase in threshold voltage ($V_t$). Cells which are subjected to UV charging and exhibit an increased $V_t$, are extremely difficult to over-program and also difficult to over-erase. If the initial $V_t$, is increased, there is less of a $V_t$ window between the erased state and the programmed state, thereby causing various reliability and operating speed problems.

Accordingly, there exists a need for microminiaturized semiconductor devices, such as flash memory devices, e.g., EEPROMS, with improved reliability and increased operating speed, and for efficient methodology enabling the fabrication of such devices with reduced UV cell charging.

DISCLOSURE OF THE INVENTION

An advantage of the present invention is a method of manufacturing semiconductor devices, particularly flash memory semiconductor devices, with improved reliability and reduced UV cell charging.

Another advantage of the present invention is a semiconductor device, e.g., a flash memory semiconductor device, having improved reliability, and reduced UV cell charging.

Additional advantages and other features of the present invention will be set forth in the description which follows and in part will be apparent to those having ordinary skill in the art upon examination of the following or may be learned from the practice of the present invention. The advantages of the present invention may be realized and obtained and particularly pointed out in the appended claims.

According to the present invention, the foregoing and other advantages are achieved in part by a method of manufacturing a semiconductor device, the method comprising: forming a transistor having a gate structure over a substrate with a gate dielectric layer therebetween; forming an interlayer dielectric over the transistor; and forming a silicon-rich silicon oxide layer, having a refractive index (R.I.) greater than 1.6, on an upper surface of the interlayer dielectric.

Another aspect of the present invention is a semiconductor device comprising: a transistor having a gate structure over a substrate with a gate dielectric layer therebetween; an interlayer dielectric over the transistor; and a silicon-rich silicon oxide layer; having a refractive index (R.I.) greater than 1.6, on an upper surface of the interlayer dielectric.

Embodiments of the present invention comprise forming the silicon-rich silicon oxide layer (SiRO) with an R.I. greater than 1.7, such as 1.7 to 2.0, and at a thickness of 400 Å to 600 Å. Embodiments of the present invention further include depositing a boron (B) and phosphorous (P)-doped silicate glass (BPSG) as the interlayer dielectric, planarizing the upper surface of the BPSG layer and then depositing the silicon-rich silicon oxide (SiRO) layer by plasma enhanced chemical vapor deposition at an elevated temperature of 450° C. to 650° C. and at a silane floor rate of 115 to 135 sccm. Embodiments of the present invention further comprise forming a gate structure comprising a tunnel oxide on the substrate, a floating gate electrode on the tunnel oxide, an interpoly dielectric, comprising an oxide/nitride/oxide (ONO) stack, on the floating gate on the floating gate and a control gate electrode on the interpoly dielectric.

Additional advantages of the present invention will become readily apparent to those skilled in this art from the following detailed description, wherein embodiments of the present invention are described simply by way of illustration of the best mode contemplated for carrying out the present invention. As will be realized, the present invention is capable of modifications in various obvious respects, all without departing from the present invention. Accordingly, the drawing and description are to be regarded as illustrative in nature, and not as restrictive.

DESCRIPTION OF THE INVENTION

Figure 1:
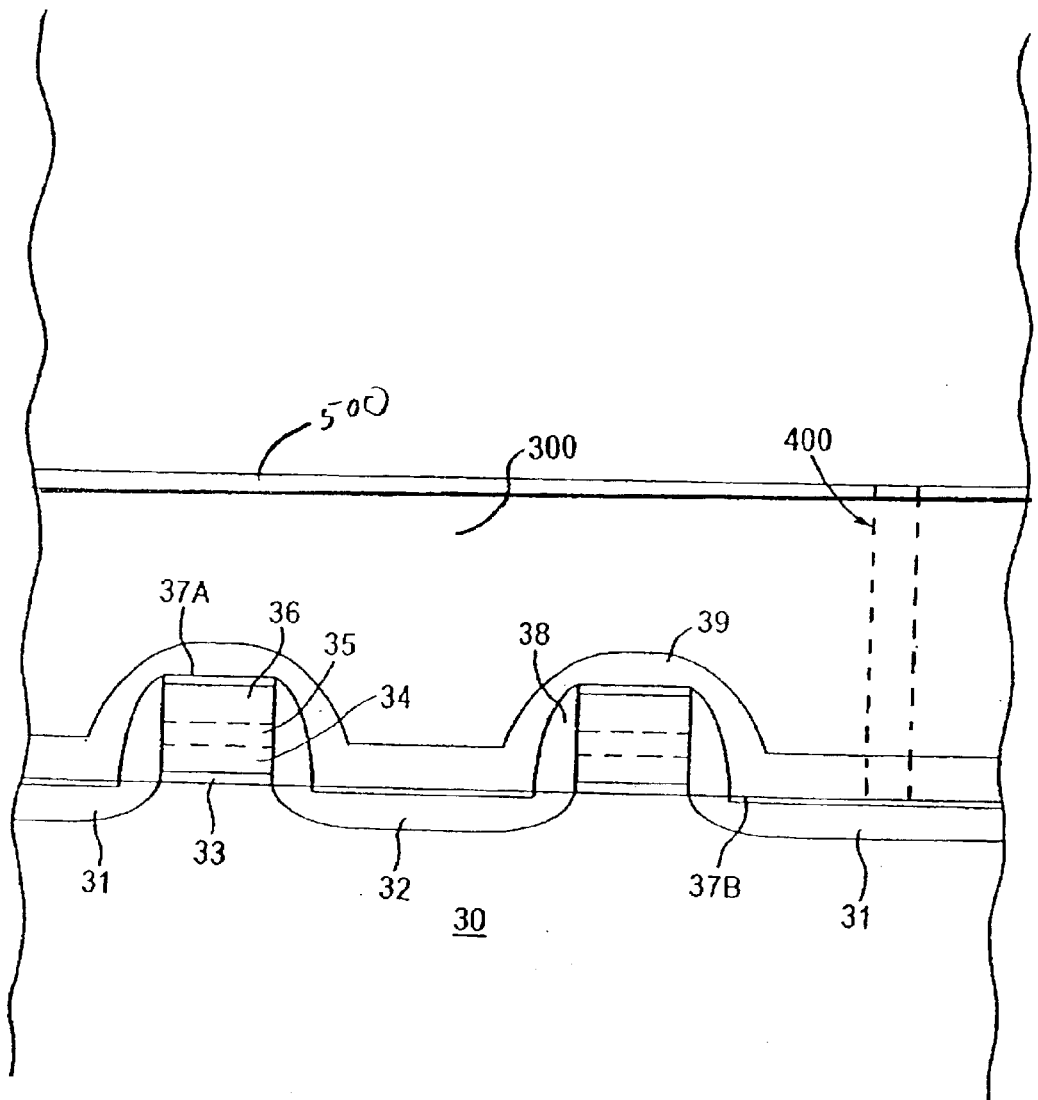
FIG. 1 schematically illustrates an embodiment of the present invention wherein a silicon-rich silicon oxide layer substantially opaque to UV radiation is employed in a semiconductor device containing a EEPROM cells.

The present invention addresses and solves various reliability problems which arise in fabricating semiconductor devices by providing efficient methodology enabling the fabrication of semiconductor devices with reduced UV degradation. Embodiments of the present invention comprise fabricating flash memory devices, e.g., EEPROM devices, with significantly reduced UV charging of cells.

Upon conducting experimentation and investigation, it was found that UV radiation generated during back end of line processing, such as deposition, metal etching and passivation, particularly plasma processing, undesirably charges cells, thereby increasing the program voltage of the cell. Such an undesirable increase in program voltage reduces the $V_t$ window between the erased state and the programmed state.

The present invention addressees and solves such UV cell charging problems by deposition of a SiRO layer which is substantially opaque to UV radiation, on the interlayer dielectric, i.e., $ILD_0$. The SiRO layer typically has a R.I. greater than 1.6, such as greater than 1.7, e.g., 1.7 to 2.0.

The present invention achieves such objectives by a plasma enhanced chemical vapor deposition technique conducted at an elevated temperature, such as a temperature of 450° C. to 550° C., e.g., 500° C., and at a silane flow rate of 100 to 150 sccm, such as 125 sccm. Such deposition may be conducted at a $N_2O$ flow rate of 165 to 195 sccm, e.g., 180 sccm, a pressure of 1.8 to 2.2 Torr, e.g., 2.0 Torr, and an RF power of 110 to 140 watts, e.g., 125 watts. The spacing (distance between the wafer and shower head from which gases exit) may be maintained at about 625 to 675 mils., e.g., 650 mils. The deposition process may be conducted for 3 to 15 seconds resulting in the deposition of an SiRO film having a thickness of 400 Å to 600 Å, e.g., 500 Å. Such a plasma enhanced chemical vapor deposition technique is effective to deposit the SiRO layer with an increase silicon content such that the R.I. is elevated to greater than 1.6, such as greater than 1.7, e.g., 1.7 to 2.0; whereas, typical silicon oxide layers exhibit a R.I. of 1.45 to 1.46. The use of a SiRO film in accordance to the present invention provides tighter Vt distribution than obtained employing conventional fabrication techniques.

An embodiment of the present invention is schematically illustrated in FIG. 1 wherein transistors are formed on substrate 30. Substrate 30 may comprise doped monocrystalline silicon or a plurality of wells or epitaxial layers. The transistors may comprise dual gate structures with an interpoly (ONO) dielectric therebetween. For example, transistors can comprise tunnel oxide 33, a floating gate electrode 34, an ONO stack interpoly dielectric 35, and a control gate 36. A layer of metal silicide 37A is formed on an upper surface of the gate electrode stack while a layer of metal silicide 37B is formed on the source/drain regions 31, 32. A dielectric sidewall spacer 38, such as silicon oxide, is formed on the side surfaces of the gate electrode. A silicon nitride etch stop layer 39 may be deposited over the gate structure on silicon oxide sidewall spacers 38. Subsequently, an interlayer dielectric ($ILD_0$) 300 is deposited, such as a BPSG layer, as by plasma enhanced chemical deposition. Planarization is then implemented, as by chemical mechanical polishing (CMP).

According to embodiments of the present invention, the SiRO layer 500 is then deposited on an upper surface of the BPSG layer 300. The SiRO layer deposited in accordance with embodiments of the present invention exhibits a R.I. greater than 1.6, e.g., 1.7 to 2.0, and, hence, blocks, UV radiation generated during subsequent back end of line processing from reaching the cells and increasing their program voltage.

Subsequent processing includes anisotropic etching to form contact holes 400 shown in phantom, through SiRO layer 500 and interlayer dielectric 300. The presence of SiRO layer 500 presents UV radiation generated during such anisotropic etching from undesirably elevating the Vt. The UV opaque SiRO layer 500 also shields the cells from UV radiation during subsequent back end of line processing, such as metallization, deposition and etching operations. In addition, the cells are shielded from UV radiation.

The present invention provides semiconductor devices with improved reliability, such as EEPROM devices with increased operating speed and reduced cell overprogramming by UV radiation, and provides enabling methodology. In accordance with embodiments of the present invention, silicon-rich silicon oxide layer is deposited on a planarized BPSG interlayer dielectric, which silicon-rich silicon oxide layer effectively blocks UV radiation generated during back end processing from reaching the cells and undesirably increasing the program voltage of the cells.

The present invention enjoys industrial applicability in manufacturing various types of semiconductor devices, particularly highly integrated semiconductor devices exhibiting increased circuit speed and sub-micron dimensions, e.g., with a design rule of about 0.12 micron and under, with high reliability. The present invention enjoys particular industrial applicability in manufacturing flash memory devices, such EEPROMs, with significantly reduced UV charging of cells.

In the preceding detailed description, the present invention is described with reference to specifically exemplary embodiments thereof. It will, however, be evident that various modifications and changes may be made thereto without departing from the broader spirit and scope of the present invention, as set forth in the claims. The specification and drawing are, accordingly, to be regarded as illustrative and not restrictive. It is understood that the present invention is capable of using various other combinations and environments and is capable of changes or modifications within the scope of the inventive concept as expressed herein.

What is claimed:

1. A semiconductor device comprising:

a transistor having a gate structure over a substrate with a gate dielectric layer therebetween;

an interlayer dielectric over the transistor and substrate; and a silicon-rich silicon oxide layer, which is substantially opaque to UV radiation and has a refractive index (R.I.) greater than 1.6, on an upper surface of the interlayer dielectric, wherein the silicon-rich silicon oxide layer has a thickness of 400 Å to 600 Å.

2. The semiconductor device according to claim 1, wherein the silicon-rich silicon oxide layer has a R.I. greater than 1.7.

3. The semiconductor device according to claim 2, wherein the silicon-rich silicon oxide layer has a R.I. of 1.7 to 2.0.

4. The semiconductor device according to claim 1, wherein the gate structure comprises:

a tunnel oxide as the gate dielectric layer on the substrate;

a floating gate electrode on the tunnel oxide;

an interpoly dielectric comprising an oxide/nitride/oxide (ONO) stack on the floating gate; and a control gate electrode on the interpoly dielectric.

5. The semiconductor device according to claim 4, comprising silicon oxide sidewall spacers on side surfaces of the gate structure.

6. The semiconductor device according to claim 5, comprising a layer of silicon nitride on an upper surface of the gate structure and on the silicon oxide sidewall spacers.

7. The semiconductor device according to claim 1, wherein the interlayer dielectric comprises a boron-phosphorous-doped silicate glass (BPSG).

* * * * *